United States Patent
Choi et al.

(10) Patent No.: US 11,658,057 B2
(45) Date of Patent: May 23, 2023

(54) WAFER CHUCK

(71) Applicant: Samsung Electronics Co., Ltd., Suwon-si (KR)

(72) Inventors: Sungil Choi, Hwaseong-si (KR); Hyeondong Song, Suwon-si (KR); Myeongshik Shim, Hwaseong-si (KR); Jonghyun Hong, Hwaseong-si (KR); Bonggyo Seo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 207 days.

(21) Appl. No.: 17/029,402

(22) Filed: Sep. 23, 2020

(65) Prior Publication Data

US 2021/0242069 A1 Aug. 5, 2021

(30) Foreign Application Priority Data

Jan. 30, 2020 (KR) ........................ 10-2020-0011351

(51) Int. Cl.
*H01L 21/683* (2006.01)
*H01L 21/687* (2006.01)

(52) U.S. Cl.
CPC .... *H01L 21/6838* (2013.01); *H01L 21/68735* (2013.01)

(58) Field of Classification Search
CPC ........... H10L 21/68375; H10L 21/6838; H10L 21/6875
See application file for complete search history.

(56) References Cited

U.S. PATENT DOCUMENTS

| | | | |
|---|---|---|---|
| 5,923,408 A * | 7/1999 | Takabayashi | G03F 7/707 269/21 |
| 7,292,427 B1 | 11/2007 | Murdoch et al. | |
| 8,748,780 B2 | 6/2014 | Moro et al. | |
| 9,960,070 B2 | 5/2018 | Huang | |
| 2003/0001103 A1* | 1/2003 | Kobayashi | H01L 21/6835 269/21 |
| 2004/0187787 A1 | 9/2004 | Dawson et al. | |
| 2018/0284071 A1* | 10/2018 | Wright | G01N 29/069 |
| 2019/0371646 A1* | 12/2019 | Liao | B25B 11/005 |

FOREIGN PATENT DOCUMENTS

| | | |
|---|---|---|
| JP | 1997-260471 A | 10/1997 |
| JP | 3312163 B2 | 8/2002 |
| JP | 3549722 B2 | 8/2004 |
| JP | 4899879 B2 | 3/2012 |
| JP | 6440587 B2 | 12/2018 |
| KR | 10-2013-0049667 A | 5/2013 |
| KR | 10-1279188 B1 | 6/2013 |
| KR | 101870659 B1 | 6/2018 |

* cited by examiner

*Primary Examiner* — Philip C Tucker
*Assistant Examiner* — Nickolas R Harm
(74) *Attorney, Agent, or Firm* — Harness, Dickey & Pierce, P.L.C.

(57) ABSTRACT

A wafer chuck includes a body portion; a vacuum barrier portion including a wall structure arranged at the same distance from a center point of the body portion; f protrusions arranged inside and outside the vacuum barrier portion, protruding from a top surface of the body portion and spaced apart from each other; and a vacuum portion including vacuum holes spaced apart from each other penetrating the body portion inside the vacuum barrier portion.

17 Claims, 11 Drawing Sheets

WAFER CHUCK

CROSS-REFERENCE TO RELATED APPLICATION

This application claims the benefit of Korean Patent Application No. 10-2020-0011351, filed on Jan. 30, 2020, in the Korean Intellectual Property Office, the disclosure of which is incorporate herein in its entirety by reference.

BACKGROUND

The inventive concepts relate to wafer chucks, and more particularly, to wafer chucks on which a wafer is seated.

The wafer chuck may be a component on which the wafer is seated when manufacturing a semiconductor chip. The wafer chuck may adsorb the wafer seated on the wafer chuck under vacuum pressure. The wafer chuck may act as a source that contaminates a back side (a rear side) of the wafer when manufacturing the semiconductor chip. As the wafer chuck may not adsorb the wafer precisely under vacuum pressure, the wafer may not only slip but also be bent or warped.

SUMMARY

The inventive concepts provide wafer chucks capable of suppressing wafer slipping, bending, and warping by strengthening a chucking force while reducing contamination of a back surface of a wafer.

According to an aspect of the inventive concepts, there is provided a wafer chuck including a body portion; a vacuum barrier portion including a wall structure arranged at the same distance from a center point of the body portion; protrusions inside and outside the vacuum barrier portion, protruding from a top surface of the body portion and spaced apart from each other; and a vacuum portion including vacuum holes spaced apart from each other penetrating the body portion inside the vacuum barrier portion.

According to an aspect of the inventive concepts, there is provided a wafer chuck including a body portion; a vacuum barrier portion including a wall structure arranged at the same distance from a center point of the body portion; protrusions inside and outside the vacuum barrier portion, protruding from a top surface of the body portion and spaced apart from each other, wherein the protrusions arranged along virtual circles, the virtual circles having a central point at the center point of the body portion, and two adjacent protrusions on one of the virtual circles and the closest adjacent protrusion on an adjacent virtual circle form a triangle, the triangle being an equidistant triangle; and a vacuum portion including vacuum holes spaced apart from each other penetrating the body portion inside the vacuum barrier portion, wherein the vacuum holes are at a center portion of the body portion and at an inner peripheral portion of the vacuum barrier portion.

According to an aspect of the inventive concept, there is provided a wafer chuck including a body portion; a paddle insertion portion including an insertion groove into which a wafer transfer paddle is configured to be inserted, on one side of the body portion; a vacuum barrier portion including a wall structure spaced apart from a center point of the body portion, on the body portion except for the paddle insertion portion, and at the same distance from the center point of the body portion; protrusions inside and outside the vacuum barrier portion, protruding from a top surface of the body portion and spaced apart from each other; and a central vacuum portion in a vicinity of a center portion inside of the vacuum barrier portion and including a first vacuum hole penetrating the body portion; and a peripheral vacuum portion in a vicinity of a periphery portion inside of the vacuum barrier portion and including a plurality of second vacuum holes spaced apart from each other penetrating the body portion.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
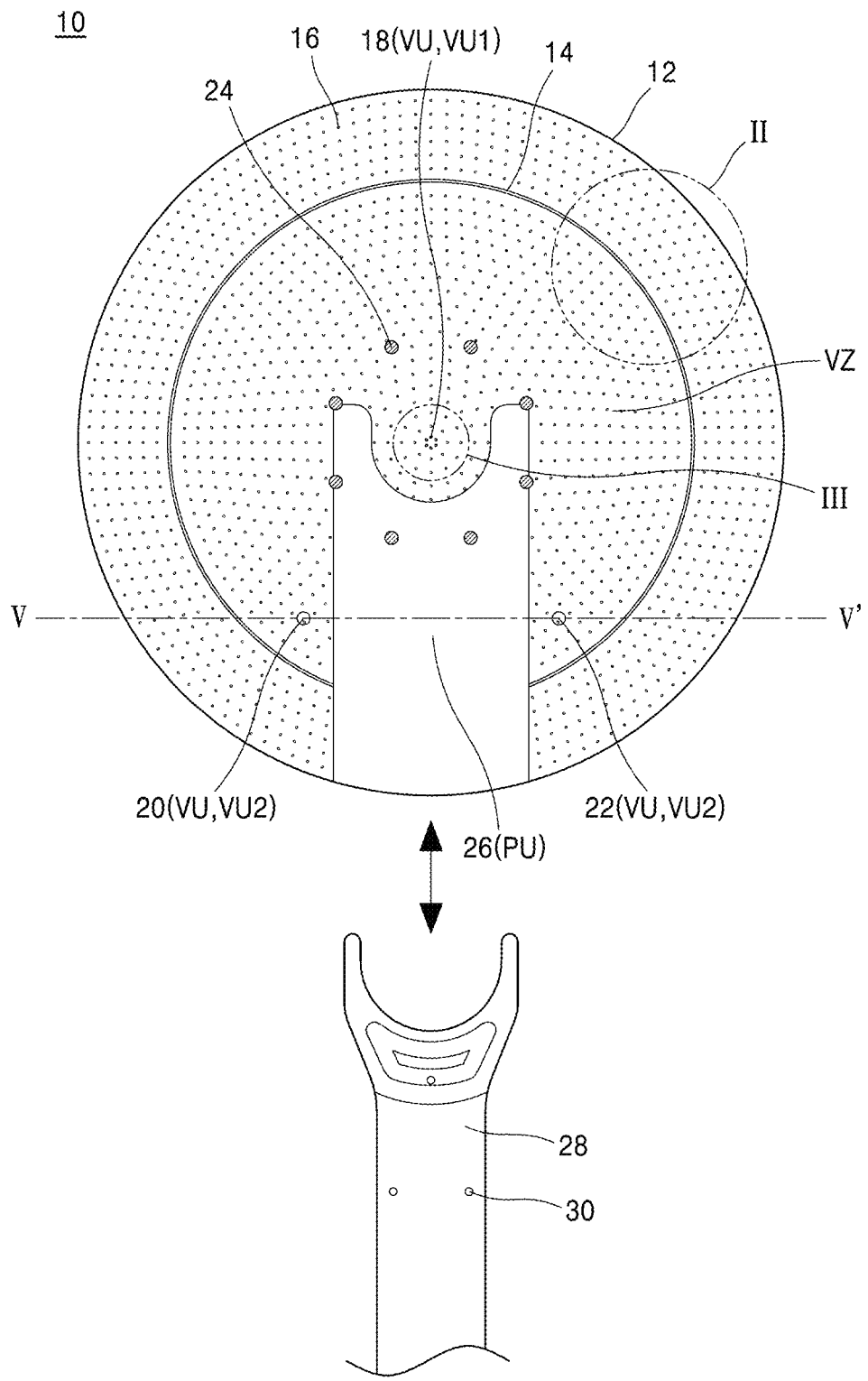
FIG. 1 is a plan view of a wafer chuck according to an example embodiment of the inventive concepts.

Hereinafter, example embodiments of the inventive concepts will be described in detail with reference to the accompanying drawings. The same or similar reference marks or reference numerals are used for the same components in the drawings, and duplicate descriptions thereof are simply described or omitted. In the following description, an upper surface and a lower surface may be relative concepts depending on positions in the drawings, and a first drawing and a second drawing may be relative concepts according to the positions of the drawings.

Figure 2:
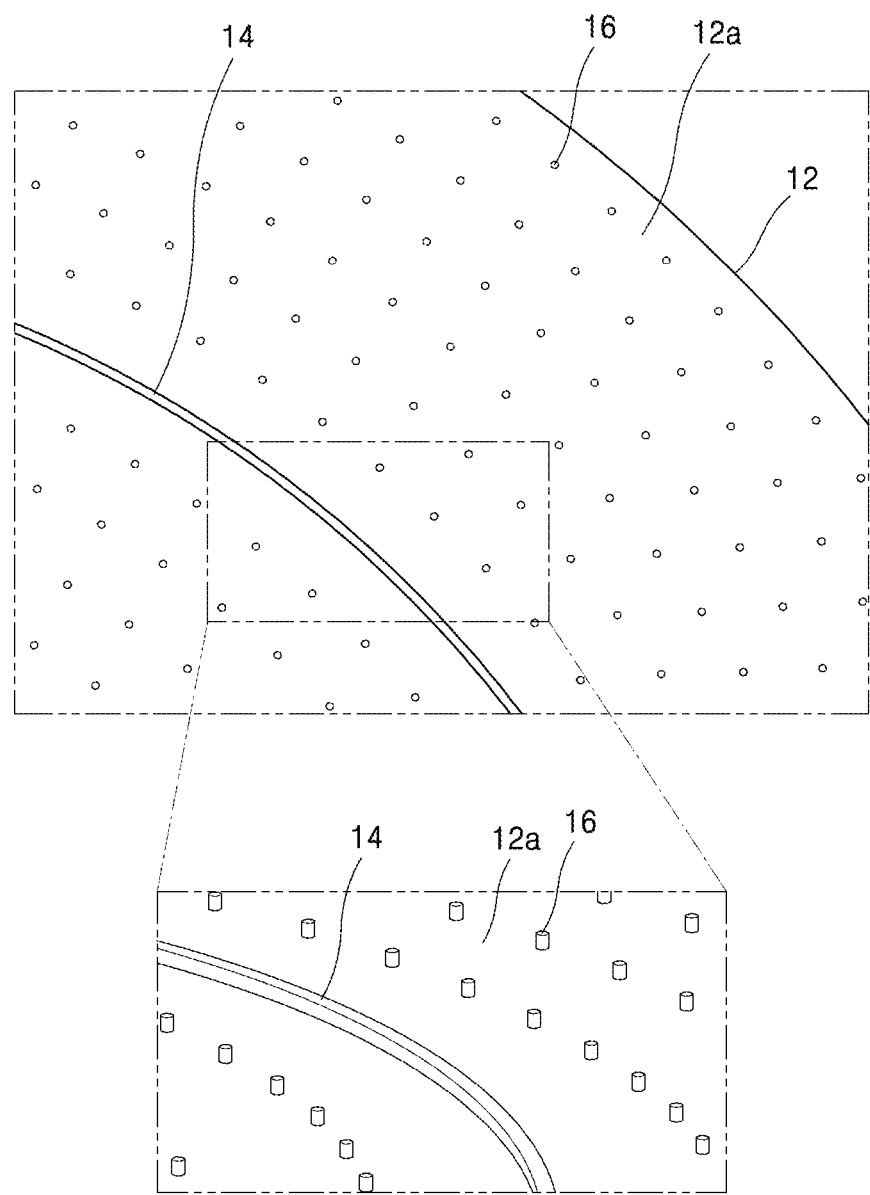
FIG. 2 is an enlarged view of region II of FIG. 1.
Figure 3:
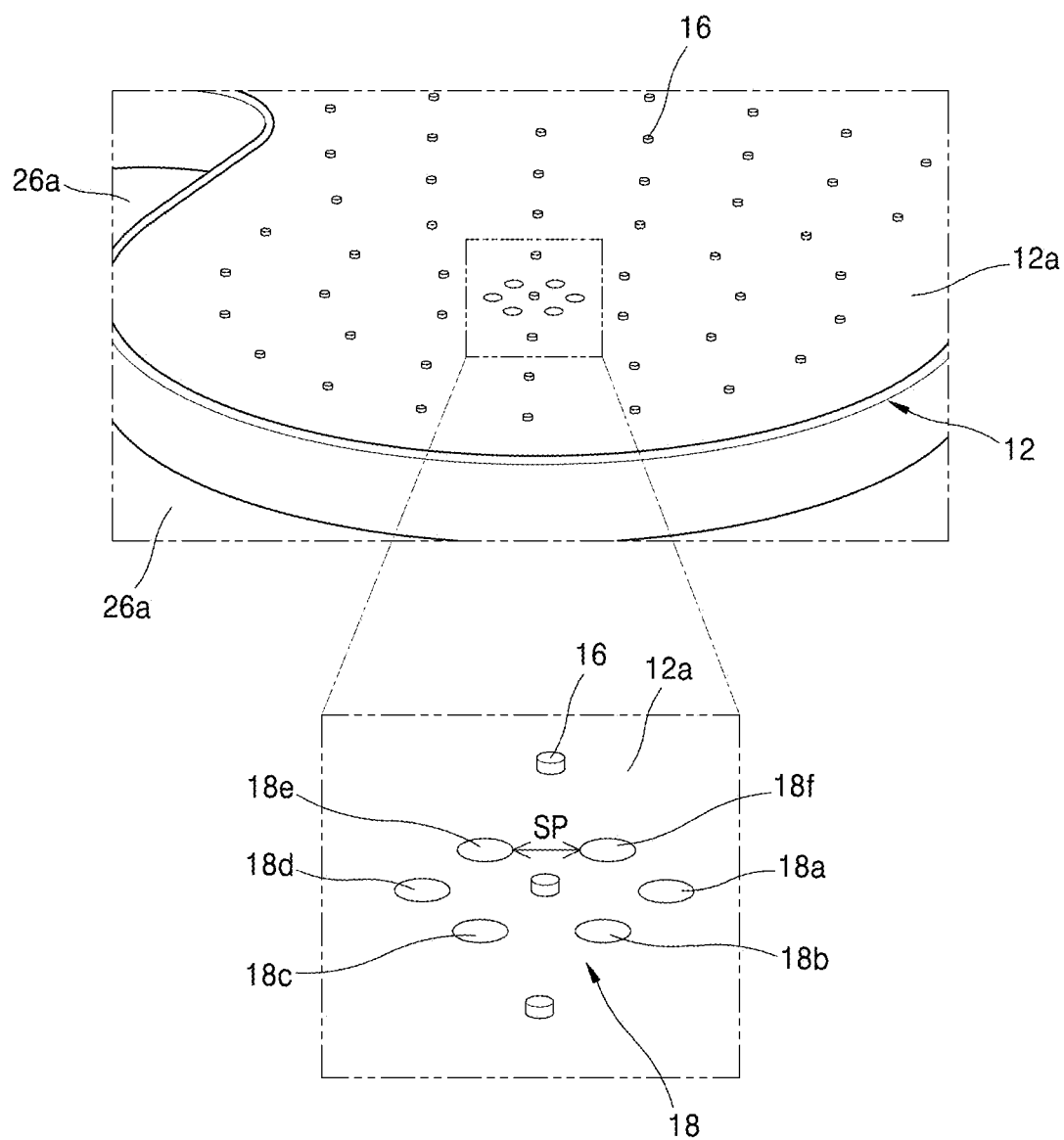
FIG. 3 is an enlarged view of region III of FIG. 1.

FIG. 1 is a plan view of a wafer chuck according to an example embodiment of the inventive concepts, FIG. 2 is an enlarged view of region II of FIG. 1, and FIG. 3 is an enlarged view of region III of FIG. 1.

Specifically, a wafer chuck 10 may be used in a thickness measuring device for measuring the thickness of a thin film formed on a wafer. The wafer chuck 10 may be used in a critical dimension measuring device that measures a critical dimension (CD) of patterns formed on the wafer.

In more detail, the wafer chuck 10 may include a body portion 12. The body portion 12 may be configured in a disk shape so that the wafer (not shown) is seated on an upper surface of the body portion 12. The body portion 12 is not limited to the disc shape (or a circular shape) and may have various three-dimensional shapes.

When the body portion 12 is configured in the disc shape, a diameter of the body portion 12 may vary depending on a diameter of the wafer. The diameter of the body portion 12 may be 6 inches (about 150 mm), 8 inches (about 200 mm), or 12 inches (about 300 mm). An example embodiment will be described as an example in which the diameter of the body portion 12 is 12 inches.

The body portion 12 may include a ceramic material. The ceramic material may have better wear resistance than metal, and thus, the wafer chuck 10 may reduce the occurrence of surface contamination when contacting the wafer. In some example embodiments, the ceramic material constituting the body portion 12 may include silicon carbide (SiC). In some example embodiments, the ceramic material constituting the body portion 12 may include $Al_2O_3$(Alumina Oxide). SiC or $Al_2O_3$ may have conductivity.

SiC or $Al_2O_3$ ceramic constituting the body portion 12 may be manufactured by a sintering method of sintering SiC or $Al_2O_3$ powder. When the body portion 12 is formed of the ceramic material rather than metal, particle adhesion to the wafer on the body portion 12 may be suppressed, thereby reducing contamination of the wafer.

The wafer chuck 10 may include a vacuum barrier portion 14 composed of a wall structure arranged at the same distance from a center point of the body portion 12, or other geometric shape, e.g., a square, with a center point at the center point of the body portion 12 if the geometric shape continued over the entire wafer chuck 10. The vacuum barrier portion 14 may be configured to protrude from a top surface 12a of the body portion 12 as shown in FIG. 2. The vacuum barrier portion 14 may be configured as a circular structure arranged at the same distance from the center point of the body portion 12. The vacuum barrier portion 14 may be configured as the circular structure spaced by a distance apart from a periphery of the body portion 12 on the surface of the body portion 12.

When the body portion 12 is configured in the disc shape, the vacuum barrier portion 14 may be arranged at ⅔ of a radius from the center point of the body portion 12. For example, when the diameter of the body portion is configured to 12 inches, an inner diameter of the vacuum barrier portion 14 may be 8 inches. An inner side of the vacuum barrier portion 14 may be a vacuum region VZ to be formed in a center direction of the body portion 12 by a vacuum portion VU as described later.

The vacuum barrier portion 14 may be formed by machining, for example, cutting the top surface 12a of the body portion 12. Accordingly, the vacuum barrier portion 14 may be made of the same material as the body portion 12. The vacuum barrier portion 14 and the body portion 12 may be configured as one body, integral.

The wafer chuck 10 may include a plurality of protrusions 16 arranged inside and outside the vacuum barrier portion 14. The protrusions 16 may protrude from the top surface 12a of the body portion 12 and may be arranged apart from each other, as shown in FIG. 2. The arrangement of the protrusions 16 will be described in more detail later.

The protrusions 16 may be formed by machining, for example, cutting the surface 12a of the body portion 12. Accordingly, the protrusions 16 may be made of the same material as the body portion 12. The protrusions 16 and the body portion 12 may be configured as one body. As a result, the vacuum barrier portion 14, the protrusions 16, and the body portion 12 may be configured as one body.

The wafer may be seated on an upper surface of the protrusions 16 and an upper surface of the vacuum barrier portion 14 as described below. Accordingly, the vacuum barrier portion 14 and the protrusions 16 may be configured to have the same height from the top surface 12a of the body portion 12. The vacuum barrier portion 14 and the protrusions 16 may have the surface of the same height.

In addition, when the wafer is seated on the upper surface of the protrusions 16, a contact area thereof may be significantly reduced than when the wafer is entirely seated on the upper surface of the body portion 12. In other words, the wafer chuck 10 may reduce the contact area because the entire back surface of the wafer does not contact the body portion 12, but a portion of the back surface of the wafer contacts the protrusions 16. Therefore, as the semiconductor manufacturing process proceeds, the wafer may contact the protrusions 16 even if the wafer is bent. The contact area between the wafer and the protrusions 16 may be variously adjusted.

The wafer chuck 10 may include a vacuum portion VU having vacuum holes, for example, first vacuum holes 18 and second vacuum holes 20 and 22, penetrating the body portion 12 inside the vacuum barrier portion 14. An inner side of the vacuum barrier portion 14 may be one vacuum area VZ by the vacuum portion VU.

The vacuum portion VU may include a central vacuum portion VU1 including the first vacuum hole 18 arranged in the vicinity of a center of the body portion 12 and a peripheral vacuum portion VU2 including the second vacuum holes 20 and 22 arranged around the inner side of the vacuum barrier portion 14.

The central vacuum portion VU1 may adsorb the wafer by applying vacuum pressure in the vicinity of a center of the wafer to be seated on the body portion 12 and the vacuum barrier portion 14. The first vacuum hole 18 constituting the central vacuum portion VU1 may include a plurality of sub-vacuum holes 18a to 18f as illustrated in FIG. 3.

In some example embodiments, the sub-vacuum holes 18a to 18f may have a hexagonal structure, and a separation distance SP between the sub-vacuum holes 18a to 18f may be the same. When the plurality of sub-vacuum holes 18a to 18f are arranged in the central vacuum portion VU1 as described above, the wafer may be adsorbed well on the body portion 12 and the vacuum barrier portion 14, so that the vicinity of the center of the wafer does not slide.

The number of sub-vacuum holes, for example, the sub-vacuum holes 18a to 18f, and the shape thereof may be various ones. The diameter of the sub-vacuum holes 18a to 18f may be the same as those of the second vacuum holes 20 and 22. In other example embodiments, the diameter of the sub-vacuum holes 18a to 18f may be less than the diameter of the second vacuum holes 20 and 22.

The peripheral vacuum portion VU2 may adsorb the wafer by applying vacuum pressure in the vicinity of the wafer to be seated on the body portion 12 and the vacuum barrier portion 14. The second vacuum holes 20 and 22 constituting the peripheral vacuum portion VU2 may be arranged around the inner side of the vacuum barrier portion 14. Accordingly, the peripheral vacuum portion VU2 may adsorb the wafer on the body portion 12 and the vacuum barrier portion 14 so that the vicinity of a peripheral portion of the wafer does not slide.

The wafer chuck 10 may include a paddle insertion portion PU having an insertion groove 26 into which a wafer transfer paddle 28 may be inserted, on one side of the body portion 12. As shown in FIG. 3, a bottom 26a of the insertion groove 26 may not be flush with the top surface 12a of the body portion 12 and may be stepped against the top surface 12a of the body portion 12. The bottom 26a of the insertion groove 26 may be positioned lower than the top surface 12a of the body portion 12. An adsorption hole 30 capable of adsorbing the wafer may be arranged on the wafer transfer paddle 28. In some example embodiments, the wafer chuck 10 may not be formed with the paddle insertion portion PU.

The second vacuum holes 20 and 22 may be arranged inside the vacuum barrier portion 14 at both sides of the insertion groove 26 constituting the paddle insertion portion PU. In some example embodiments, the second vacuum holes 20 and 22 may be symmetrically arranged on both sides with respect to the paddle insertion portion PU. When the second vacuum holes 20 and 22 are arranged on both sides of the paddle insertion portion PU, the peripheral vacuum portion VU2 may absorb the wafer on the body portion 12 and the vacuum barrier unit 14 well so that the vicinity of the peripheral portion of the wafer does not slide.

The wafer chuck 10 may be provided with insertion holes 24 into which a fastening member that may be fastened with a support plate (32 of FIG. 5) supporting the body portion 12 may be inserted. The insertion holes 24 may be arranged inside the paddle insertion portion PU or inside the vacuum barrier portion 14. The shape or arrangement of the insertion holes 24 may be various ones.

The wafer chuck 10 as described above may include the vacuum barrier portion 14 spaced from the center point of the body portion 12 and made of ceramic, the plurality of protrusions 16 spaced apart from each other on the entire surface of the body portion 12, and the vacuum portion VU including vacuum holes, that is, the first vacuum hole 18 and the first and second vacuum holes 20 and 22, arranged inside the vacuum barrier portion 14.

Accordingly, the wafer chuck 10 may minimize contamination of the back surface of the wafer mounted on the body portion 12 and also may strengthen chucking force by using the central vacuum portion VU1 and the peripheral vacuum portion VU2 to suppress sliding, bending, and warping of the wafer.

The wafer chuck 10 may suppress sliding, bending, and warping of the wafer, by including the plurality of protrusions 16 and thus strengthening grip force between the wafer and the protrusions 16.

In addition, the wafer chuck 10 may suppress sliding of the wafer, by including the plurality of protrusions 16 and thus strengthening chucking force between the wafer and the protrusions 16 even when the wafer is bent.

Figure 4:
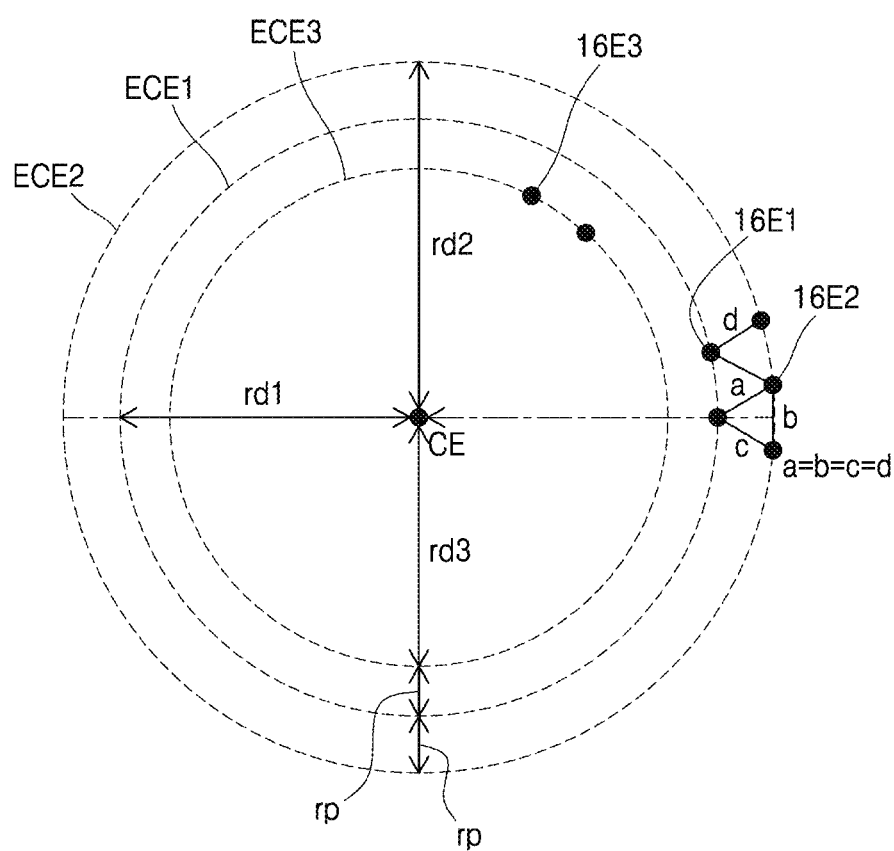
FIG. 4 is a plan view for explaining the arrangement of protrusions of a wafer chuck according to an example embodiment of the inventive concepts.

FIG. 4 is a plan view for explaining the arrangement of protrusions of a wafer chuck according to an example embodiment of the inventive concepts.

Specifically, protrusions 16 of the wafer chuck (10 in FIG. 1) may be arranged radially from the center point of the body portion (12 in FIG. 1). In FIG. 4, for convenience, reference numbers of protrusions 16 are separately denoted as 16E1, 16E2, and 16E3.

The protrusions 16E1, 16E2, and 16E3 may be arranged along a plurality of virtual circles ECE1, ECE2, and ECE3, respectively, the virtual circles ECE1, ECE2, and ECE3 arranged at the same distance from the center point CE of the body portion (12 of FIG. 1). The protrusions 16E1, 16E2, and 16E3 represent the plurality of protrusions 16 along each respective virtual circle ECE1, ECE2, and ECE3. The virtual circles ECE1, ECE2, and ECE3 may be separated by a radiation pitch RP. The protrusions 16E1, 16E2, and 16E3 may be arranged spaced apart from each other in each of the virtual circles ECE1, ECE2, and ECE3.

When a triangle is formed by connecting the one of the protrusions 16E1 and the closest two protrusions 16E2 to each other between the adjacent virtual circles ECE1, ECE2, and ECE3, the distances a, b, and c of three sides of the triangle may be the same. In other words, the distances a, b, and c between the protrusions 16E1 and 16E2 arranged at vertexes of the triangle may be the same. The relationship between the adjacent virtual circles ECE1 and ECE2 may be equally applied to the adjacent virtual circles ECE1 and ECE3, and other adjacent virtual circles.

In some example embodiments, the separation distances a, b, and c may be 10 mm or less. The total number of protrusions, for example, the protrusions 16E1, 16E2, and 16E3, arranged on the body portion 12 of FIG. 1 may be 500 or more. In some example embodiments, the separation distances a, b, and c may be 7 mm or less. The total number of protrusions, for example, the protrusions 16E1, 16E2, and 16E3, arranged on the body portion 12 of FIG. 1 may be 1000 or more.

More specifically, the protrusions 16E1, 16E2, and 16E3 may include the first protrusions 16E1 arranged spaced apart from each other along the first virtual circle ECE1 arranged at a first distance rd1 from the center point CE of the body portion 12 of FIG. 1.

The protrusions 16E1, 16E2, and 16E3 may include the second protrusions 16E2 arranged spaced apart from each other along the second virtual circle ECE2 arranged at a second distance rd2 from the center point CE of the body portion 12 of FIG. 1. The protrusions 16E1, 16E2, and 16E3 may include the third protrusions 16E3 arranged spaced apart from each other along the third virtual circle ECE3 arranged at a third distance rd3 from the center point CE of the body portion 12 of FIG. 1.

Here, the arrangement relationship of the protrusions 16E1, 16E2, and 16E3 will be described by using the first protrusion 16E1 and the second protrusion 16E2. The distances a, b, and c of the three sides of the triangle that is constructed by connecting one first protrusion 16E1 and the two second protrusions 16E2 closest to the first protrusion 16E1 to each other may be arranged to be the same. In addition, the distances a, b, and c of the three sides of the triangle that is constructed by connecting the two first protrusions 16E1 and one second protrusion 16E2 closest to the first protrusions 16E1 to each other may be arranged to be the same. In other words, any three adjacent protrusions 16 along two adjacent virtual circles ECE may form an equidistant triangle, in which all three sides are equal, with each protrusion 16 at a vertex.

In some example embodiments, the number of protrusions 16 may be determined by a safety factor, which is the ratio of fracture stress of the wafer to stress applied to the wafer, when the stress is applied to the wafer seated on the body portion 12 by vacuum pressure. For example, the number of protrusions 16 may be determined by the safety factor of 10 or more for safety.

Figure 5:
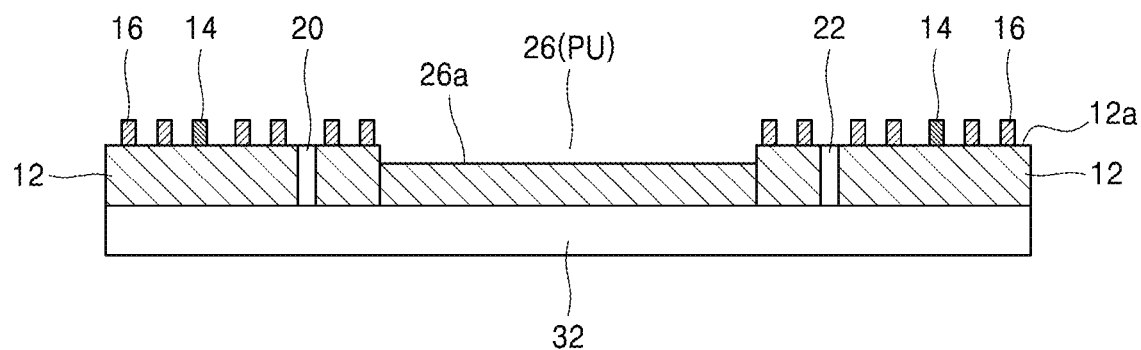
FIG. 5 is a schematic cross-sectional view of a wafer chuck according to an example embodiment of the inventive concepts.
Figure 6:
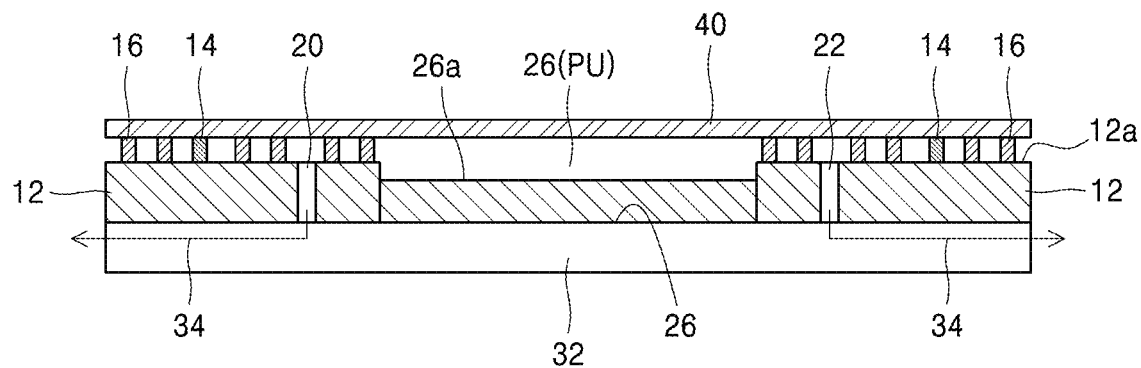
FIG. 6 is a cross-sectional view showing a wafer adsorbed by vacuum pressure on the wafer chuck of FIG. 5.

FIG. 5 is a schematic cross-sectional view of a wafer chuck according to an example embodiment of the inventive concepts, and FIG. 6 is a cross-sectional view showing a wafer adsorbed by vacuum pressure on the wafer chuck of FIG. 5.

Specifically, FIG. 5 may be a cross-sectional view taken along line V-V' of FIG. 1. The wafer chuck 10 may be attached on the support plate 32. The wafer chuck 10 may include the paddle insertion portion PU having the insertion groove 26 into which the wafer transfer paddle 28 in FIG. 1 may be inserted, in the central portion of the body portion 12 in a cross-sectional view. As shown in FIGS. 5 and 6, the bottom 26a of the insertion groove 26 may not be flush with the top surface 12a of the body portion 12 and may be stepped against the top surface 12a of the body portion 12. The bottom 26a of the insertion groove 26 may be positioned lower than the top surface 12a of the body portion 12.

The vacuum barrier portion 14 may be provided on the body portion 12 around the paddle insertion portion PU in a cross-sectional view. The vacuum barrier portion 14 may be arranged symmetrically around the paddle insertion portion PU. The plurality of protrusions 16 may be arranged inside and outside the vacuum barrier portion 14 on the body portion 12. The second vacuum holes 20 and 22 penetrating the body portion 12 may be installed between the protrusions 16. Vacuum lines 34 may be installed to each of the second vacuum holes 20 and 22 to adsorb a wafer 40 under vacuum pressure.

As shown in FIG. 6, the wafer chuck 10 may reduce or adjust the contact area between the vacuum barrier portion 14 and the protrusions 16 and the wafer 40, and also may adjust the vacuum pressure, thereby adsorbing the wafer 40 on the vacuum barrier portion 14 and protrusions 16 without bending or warping of the wafer.

Figure 7:
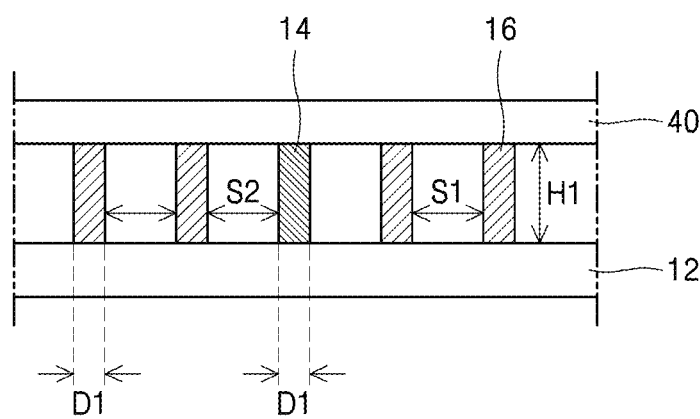
FIG. 7 is a cross-sectional view showing a shape of a vacuum barrier portion and protrusions of a wafer chuck according to an example embodiment of the inventive concepts.

FIG. 7 is a cross-sectional view showing a shape of a vacuum barrier portion and protrusions of a wafer chuck according to an example embodiment of the inventive concepts.

Specifically, the wafer chuck 10 may be arranged with the vacuum barrier portion 14 and the protrusions 16 on the body portion 12. Heights of the vacuum barrier portion 14 and the protrusions 16 may be the same as a height H. The heights H of the vacuum barrier portion 14 and the protrusions 16 may be 1 mm or less. The vacuum barrier portion 14 and the protrusions 16 may be cylindrical, although other shapes may be used. Diameters of the vacuum barrier portion 14 and the protrusions 16 may be the same as a diameter D1.

A separation distance between the protrusions 16 may be S1. The separation distance S1 between the protrusions 16 may be several mm, for example, under 7 mm, or, 1 mm, 3 mm, 5 mm or 7 mm. A separation distance between the vacuum barrier portion 14 and the protrusions 16 may be S2. The separation distance S2 between the vacuum barrier portion 14 and the protrusions 16 may be several mm, for example, under 7 mm, or 1 mm, 3 mm, 5 mm or 7 mm.

Figure 8:
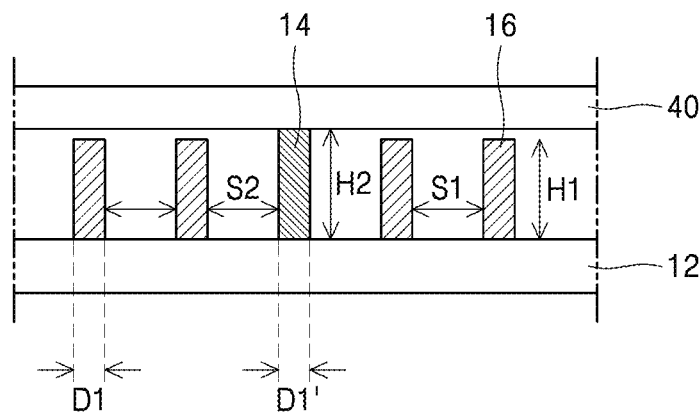
FIG. 8 is a cross-sectional view showing a shape of a vacuum barrier portion and protrusions of a wafer chuck according to an example embodiment of the inventive concepts.

FIG. 8 is a cross-sectional view showing shapes of a vacuum barrier portion and protrusions of a wafer chuck according to an example embodiment of the inventive concepts.

Specifically, a wafer chuck 10-1 may be the same as the wafer chuck 10 in FIG. 7, except that the height of the vacuum barrier portion 14 is different. In FIG. 8, the same description previously given with respect to FIG. 7 is briefly given or omitted.

The wafer chuck 10-1 may be arranged with the vacuum barrier portion 14 and the protrusions 16. A height H2 from a top surface of the body portion 12 to a top surface of the vacuum barrier portion 14 may be greater than the height H1 from the top surface of the body portion 12 to a top surface of the protrusions 16. The height H1 may be the same as the height H previously. The top surfaces of vacuum barrier portion 14 and the protrusions 16 may have different heights.

When the height H2 of the vacuum barrier portion 14 is greater than the height H1 of the protrusions 16, a slight gap may be formed between the protrusions 16 and the wafer 40. The heights H of the vacuum barrier portion 14 and the protrusions 16 may be 1 mm or less. In some example embodiments, the diameter D1' of the vacuum barrier portion 14 may be greater or less (different) than the diameter D1 of the protrusions 16.

The wafer chucks 10 and 10-1 described above may control stress applied to the wafer 40 by the contact area or the vacuum pressure, by variously adjusting the heights H, H1, and H2, the separation distances S1 and S2 and the numbers of vacuum barrier portions 14 and protrusions 16. Accordingly, in the wafer chuck 10, the wafer 40 on the vacuum barrier portion 14 and the protrusions 16 on the body portion 12 may be precisely adsorbed by vacuum pressure.

Figure 9:
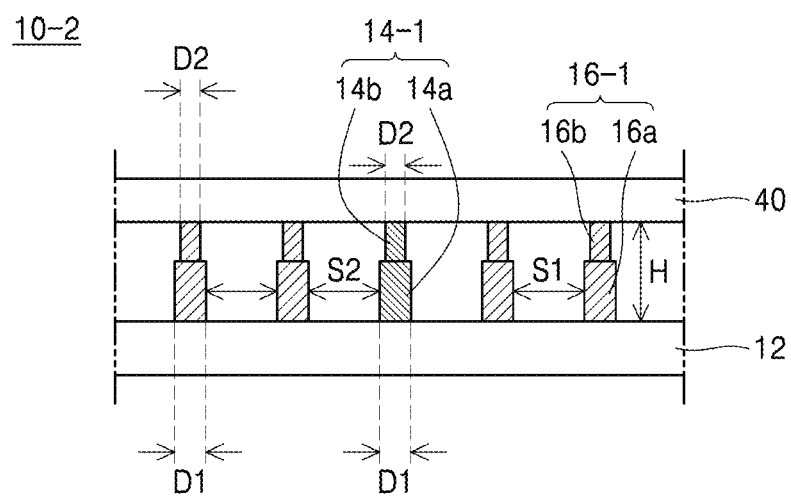
FIG. 9 is a cross-sectional view showing a shape of a vacuum barrier portion and protrusions of a wafer chuck according to an example embodiment of the inventive concepts.

FIG. 9 is a cross-sectional view showing shapes of a vacuum barrier portion and protrusions of a wafer chuck according to an example embodiment of the inventive concepts.

Specifically, a wafer chuck 10-2 may be the same as the wafer chuck 10 in FIG. 7, except that the shapes of a vacuum barrier portion 14-1 and protrusions 16-1 are different. In FIG. 9, the same description previously given with respect to FIG. 7 is briefly given or omitted.

The vacuum barrier portion 14-1 may include a first sub-vacuum barrier portion 14a arranged on the body portion 12 and a second sub-vacuum barrier portion 14b arranged on the first sub-vacuum barrier portion 14a, wherein the second sub-vacuum barrier portion 14b has a smaller cross-sectional area than the first sub-vacuum barrier portion 14a.

The protrusions 16-1 may include a first sub-protrusion 16a arranged on the body portion 12 and a second sub-protrusion 16b arranged on the first sub-protrusion 16a, wherein the second sub-protrusion 16b has a smaller cross-sectional area than the first sub-protrusion 16a.

The vacuum barrier portion 14-1 and the protrusions 16-1 may have a height H as described above. The heights H of the vacuum barrier portion 14-1 and the protrusions 16-1 may be 1 mm or less as described above. The first sub-vacuum barrier portion 14a and the first sub-protrusion 16a may have a diameter D1. In some example embodiments, the diameters of the first sub-vacuum barrier portion 14a and the first sub-protrusion 16a may be different.

Diameters of the second sub-vacuum barrier portion 14b and the second sub-protrusion 16b may be D2, which is less than the diameter D1. Accordingly, the second sub-vacuum barrier portion 14b and the second sub-protrusion 16b may have a smaller cross-sectional area than the first sub-vacuum barrier portion 14a and the first sub-protrusion 16a, respectively. In some example embodiments, the diameters of the second sub-vacuum barrier portion 14b and the second sub-protrusion 16b may be different. The first sub-vacuum barrier portion 14a and the first sub-protrusion 16a and the second sub-vacuum barrier portion 14b and the second sub-protrusion 16b may have a stepped transition, or a gradual transition from D1 to D2.

The wafer chuck 10-2 may adjust the stress applied to the wafer by a contact area with the wafer 40 or vacuum pressure, by adjusting cross-sectional areas of the vacuum barrier portion 14-1 and the protrusions 16-1. Accordingly, in the wafer chuck 10-1, the wafer 40 on the vacuum barrier portion 14-1 and the protrusions 16-1 on the body portion 12 may be precisely adsorbed by vacuum pressure.

Figure 10:
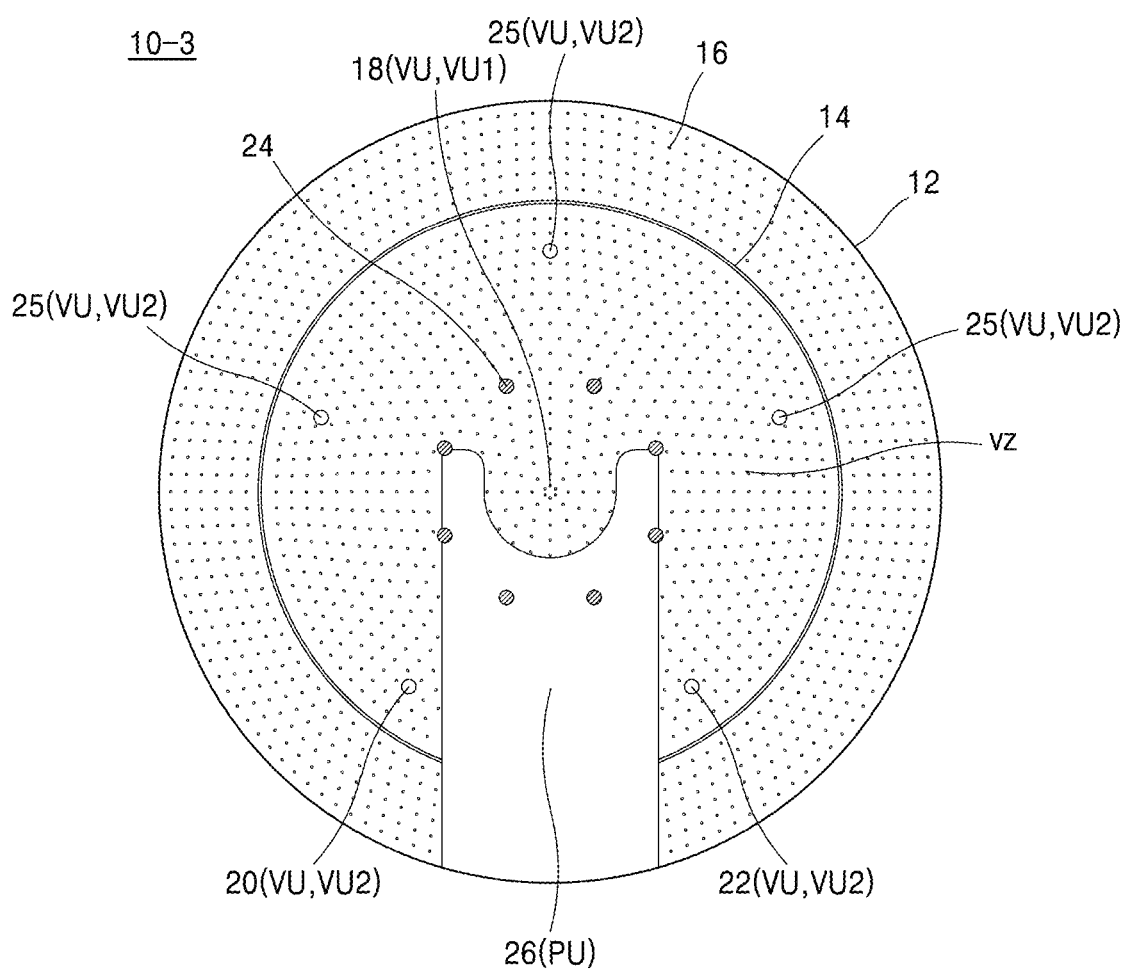
FIG. 10 is a plan view showing a wafer chuck according to an example embodiment of the inventive concepts.

FIG. 10 is a plan view showing a wafer chuck according to an example embodiment of the inventive concepts.

Specifically, a wafer chuck 10-3 may be the same as the wafer chuck 10 of FIG. 1, except that the wafer chuck 10-3 includes the peripheral vacuum portion VU2 additionally having second vacuum holes 25. In FIG. 10, the same reference numerals as those in FIG. 1 may denote the same members, and the same descriptions as those of FIG. 1 are briefly given or omitted.

The wafer chuck 10-3 may include the vacuum portion VU having vacuum holes, for example, the first vacuum hole 18 and second vacuum holes 20, 22, and 25, passing through the body portion 12 inside the vacuum barrier portion 14. The vacuum portion VU may include the central vacuum portion VU1 including the first vacuum hole 18 arranged in the vicinity of the center of the body portion 12 and the peripheral vacuum portion VU2 including the second vacuum holes 20, 22, and 25 arranged around the inner side of the vacuum barrier portion 14.

The wafer chuck 10-3 may additionally have the second vacuum holes 25 around the inner side of the vacuum barrier portion 14 with the peripheral vacuum portion VU2. The additional second vacuum holes 25 may be arranged around the inner side of the vacuum barrier portion 14 in front of the paddle insertion portion PU rather than both sides of the paddle insertion portion PU. When the peripheral vacuum portion VU2 includes the additional second vacuum holes 25, as described above, the vacuum uniformity of the vacuum region VZ formed inside the vacuum barrier portion 14 may be further improved.

Accordingly, the peripheral vacuum portion VU2 may adsorb the wafer well on the body portion 12 and the vacuum barrier portion 14 so that the vicinity of the peripheral portion of the wafer does not slide. As a result, the wafer chuck 10-3 may reliably adsorb the wafer on the body portion 12 and the vacuum barrier portion 14 by using the central vacuum portion VU1 and the peripheral vacuum portion VU2.

Figure 11:
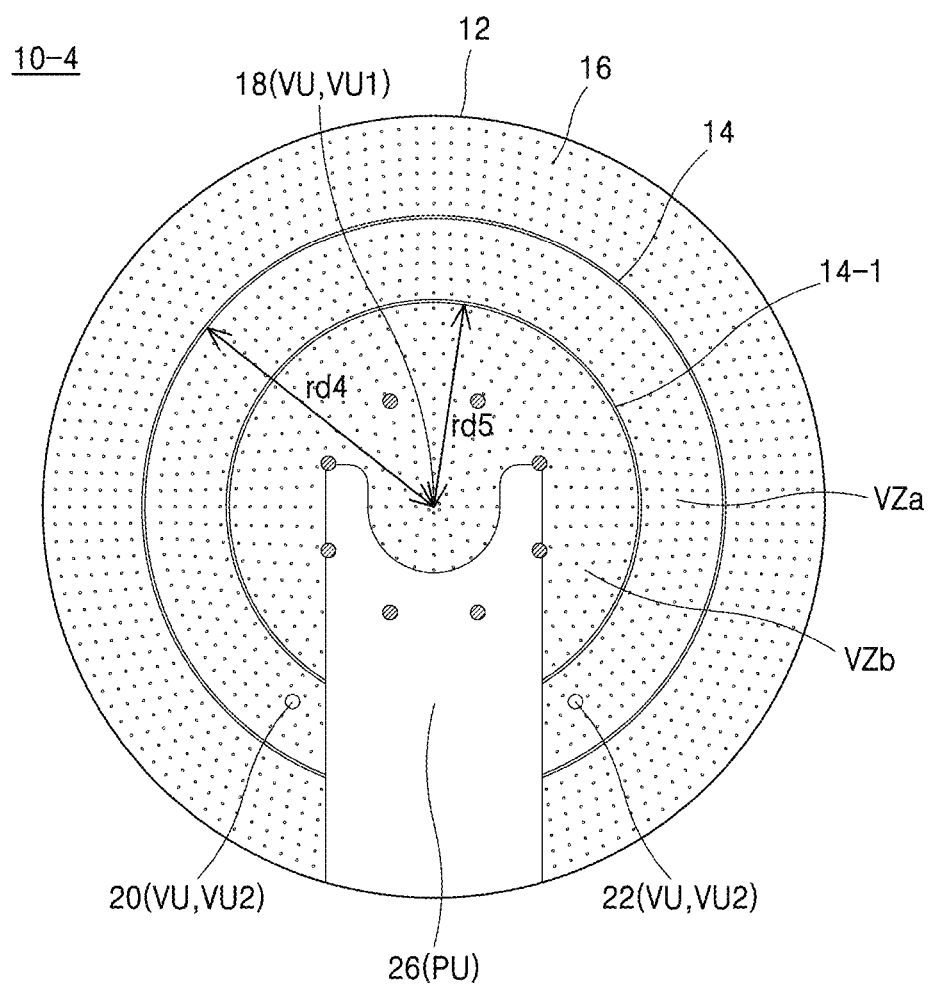
FIG. 11 is a plan view showing a wafer chuck according to an example embodiment of the inventive concepts.

FIG. 11 is a plan view showing a wafer chuck according to an example embodiment of the inventive concepts.

Specifically, a wafer chuck 10-4 may be the same as the wafer chuck 10 of FIG. 1, except that a second vacuum barrier portion 14-1 is provided. In FIG. 11, the same reference numerals as those in FIG. 1 may denote the same members, and the same descriptions as those of FIG. 1 are briefly given or omitted.

The wafer chuck 10-4 may include the vacuum barrier portion 14 arranged apart from the center point of the body portion 12 by a distance rd4. Here, the vacuum barrier portion 14 may be referred to as a first vacuum barrier portion. The wafer chuck 10-4 may further include a second vacuum barrier portion 14-1 arranged at a distance rd5 that is less than the distance rd4 from the center point of the body portion 12.

Accordingly, the wafer chuck 10-4 may include a first vacuum region VZa formed inside the vacuum barrier portion 14 and a second vacuum region VZb formed inside the second vacuum barrier portion 14-1. The first vacuum region VZa may be formed in the peripheral vacuum portion VU2 including the second vacuum holes 20 and 22. The second vacuum region VZb may be formed in the central vacuum portion VU1 including the first vacuum hole 18.

When the wafer chuck 10-4 is provided with the second vacuum barrier portion 14-1 as described above, the first and second vacuum regions VZa and VZb formed on the body portion 12 may be partitioned to further improve the vacuum uniformity. Accordingly, the wafer chuck 10-4 may adsorb the wafer well on the body portion 12 and the vacuum barrier portion 14 and the second vacuum barrier portion 14-1 so that the vicinity of the center of the wafer or the vicinity of the peripheral of the wafer does not slide.

Figure 12:
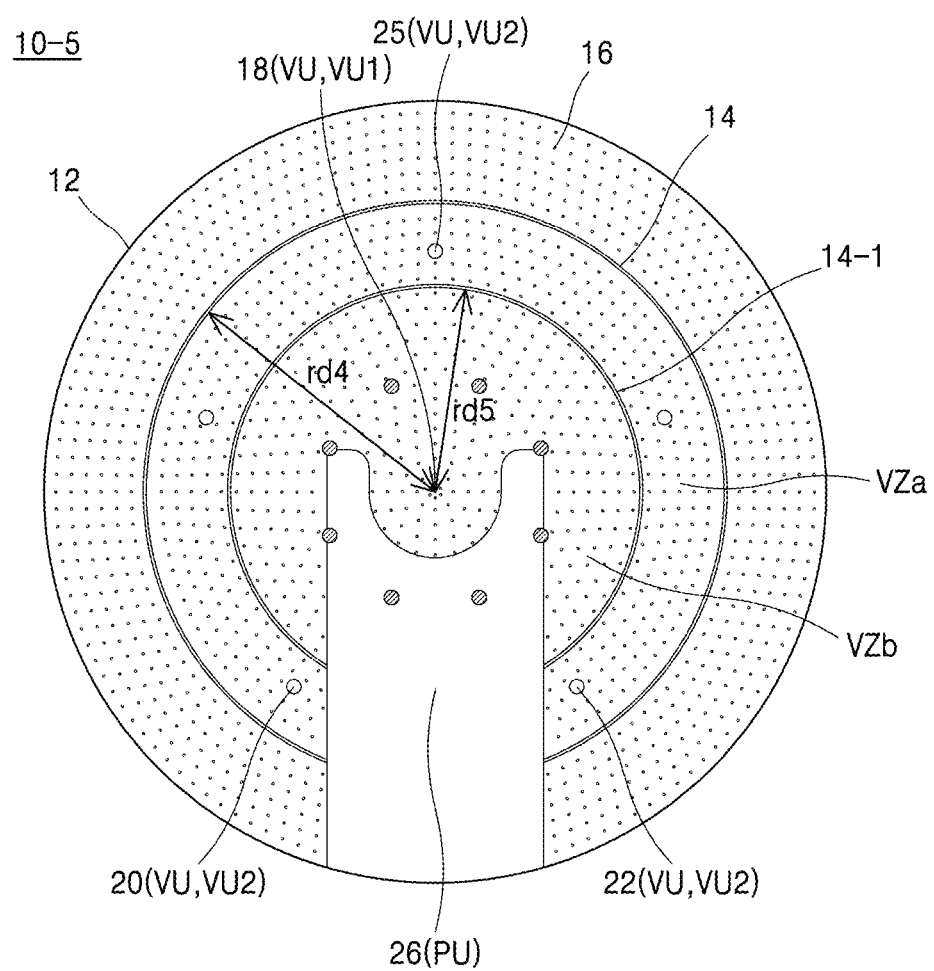
FIG. 12 is a plan view showing a wafer chuck according to an example embodiment of the inventive concepts.

FIG. 12 is a plan view showing a wafer chuck according to an example embodiment of the inventive concepts.

Specifically, a wafer chuck 10-5 may be the same as the wafer chuck 10 of FIG. 1, except that the wafer chuck 10-5 has the peripheral vacuum portion VU2 additionally having second vacuum holes 25 and the second vacuum barrier portion 14-1.

In addition, the wafer chuck 10-5 may be the same as the wafer chuck 10-4 of FIG. 11, except that the wafer chuck 10-5 has the peripheral vacuum portion VU2 additionally having the second vacuum holes 25. In FIG. 12, the same reference numerals as in FIGS. 1 and 11 denote the same members, and the same descriptions as those of FIGS. 1 and 11 are briefly given or omitted.

The wafer chuck 10-5 may include the vacuum barrier portion 14 arranged apart from the center point of the body portion 12 by the first distance rd4. The wafer chuck 10-5 may include the second vacuum barrier portion 14-1 arranged at the distance rd5 that is less than the distance rd4 from the center point of the body portion 12. The wafer chuck 10-5 may additionally include the second vacuum holes 25 around the inside of the vacuum barrier portion 14.

Accordingly, the wafer chuck 10-5 may include the first vacuum region VZa formed inside the vacuum barrier portion 14 and the second vacuum region VZb formed inside the second vacuum barrier portion 14-1. The first vacuum region VZa may be formed in the peripheral vacuum portion VU2 including the second vacuum holes 20, 22, and 25. The second vacuum region VZb may be formed in the central vacuum portion VU1 including the first vacuum hole 18.

When the wafer chuck 10-5 is provided with the second vacuum barrier portion 14-1 and the additional vacuum holes, that is, the second vacuum holes 25, the first and second vacuum regions VZa and VZb to be formed on the body portion 12 may be partitioned, thereby further improving the vacuum uniformity of the first and second vacuum regions VZa and VZb. Accordingly, the wafer chuck 10-5 may adsorb the wafer well on the body portion 12, the vacuum barrier portion 14, and the second vacuum barrier portion 14-1 so that the vicinity of the center of the wafer or the vicinity of the peripheral of the wafer is not sliding.

Figure 13:
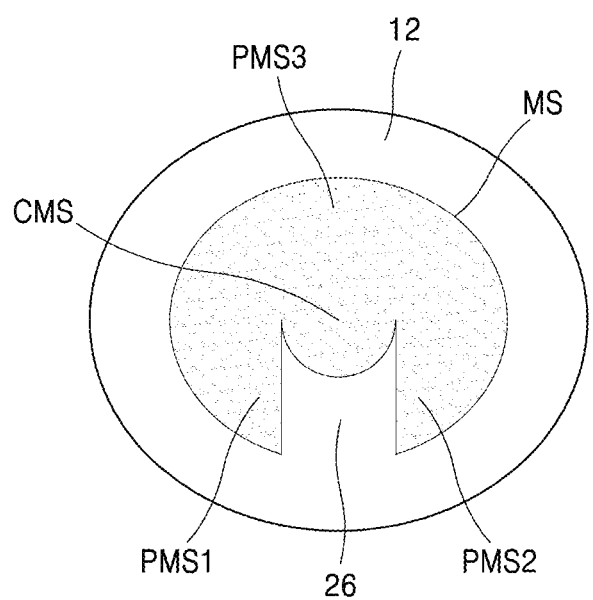
FIG. 13 is a diagram showing maximum stress distribution of a wafer adsorbed on a wafer chuck according to an example embodiment of the inventive concepts.

FIG. 13 is a diagram showing maximum stress distribution of a wafer adsorbed on a wafer chuck according to an example embodiment of the inventive concepts.

Specifically, FIG. 13 shows the maximum stress distribution MS to be applied to the wafer when the wafer is adsorbed onto the wafer chuck 10 of FIG. 1 by simulation. As shown in FIG. 13, the shape of the maximum stress distribution MS to be applied to the wafer may correspond to the vacuum region VZ of FIG. 1.

As shown in FIG. 13, as shown in the maximum stress distribution MS, the maximum stress distribution MS is uniformly distributed without a difference between the maximum stress CMS in the central portion of the body portion 12 and the maximum stresses PMS1, PMS2, and PMS3 in the peripheral portion of the body portion 12. In other words, the vacuum uniformity in the vacuum region VZ of FIG. 1 is excellent, so that there may be no difference between the maximum stress CMS in the central portion of the body portion 12 and the maximum stresses PMS1, PMS2, and PMS3 in the peripheral portion of the body portion 12.

While the inventive concept has been particularly shown and described with reference to embodiments thereof, it will be understood that various changes in form and details may be made therein without departing from the spirit and scope of the following claims.

What is claimed is:

1. A wafer chuck comprising:
   a body portion;
   a vacuum barrier portion including a wall structure arranged at a same distance from a center point of the body portion;
   protrusions inside and outside the vacuum barrier portion, protruding from a top surface of the body portion and spaced apart from each other; and
   a vacuum portion including vacuum holes spaced apart from each other penetrating the body portion inside the vacuum barrier portion, the vacuum holes including a first set of vacuum holes, the first set of vacuum holes including subvacuum holes arranged around a central protrusion of the protrusions and between the central protrusion and protrusions adjacent to the central protrusion.

2. The wafer chuck of claim 1, wherein the body portion has a disc shape and the body portion includes a ceramic.

3. The wafer chuck of claim 1, wherein the vacuum barrier portion and the protrusions have top surfaces of the same height.

4. The wafer chuck of claim 1, wherein a height from the top surface of the body portion to a top surface of the vacuum barrier portion is greater than a height from the top surface of the body portion to top surfaces of the protrusions.

5. The wafer chuck of claim 1, wherein the vacuum barrier portion, the protrusions, and the body portion are configured as one body.

6. The wafer chuck of claim 1, wherein the vacuum barrier portion includes a circular structure spaced by a distance from a circumference of the body portion on the top surface of the body portion.

7. The wafer chuck of claim 1, wherein the vacuum barrier portion includes a first vacuum barrier portion at a first distance from the center point of the body portion and a second vacuum barrier portion at a second distance different than the first distance from the center point of the body portion.

8. The wafer chuck of claim 1, wherein the protrusions include a first sub-protrusion portion on the body portion and a second sub-protrusion portion on the first sub-protrusion portion, wherein a diameter of the second sub-protrusion portion is less than a diameter of the first sub-protrusion portion.

9. The wafer chuck of claim 1, wherein, when a wafer is seated on the vacuum barrier portion and the protrusions on the body portion, an inner region of the vacuum barrier portion on the body portion includes one vacuum region through the vacuum holes in the vacuum portion.

10. A wafer chuck comprising:
    a body portion;
    a vacuum barrier portion including a wall structure arranged at a same distance from a center point of the body portion;
    protrusions inside and outside the vacuum barrier portion, protruding from a top surface of the body portion and spaced apart from each other,
    wherein the protrusions are arranged along virtual circles, the virtual circles having a central point at the center point of the body portion, and two adjacent protrusions on one of the virtual circles and a closest adjacent protrusion on an adjacent virtual circle form a triangle, the triangle being an equidistant triangle; and
    a vacuum portion including vacuum holes spaced apart from each other penetrating the body portion inside the vacuum barrier portion, the vacuum holes including a first set of vacuum holes, the first set of vacuum holes including subvacuum holes arranged around a central protrusion of the protrusions and between the central protrusion and protrusions adjacent to the central protrusion, wherein the first set of vacuum holes are at a center portion of the body portion and a second set of vacuum holes are at an inner peripheral portion of the vacuum barrier portion.

11. The wafer chuck of claim of 10, wherein the protrusions include
    first protrusions spaced apart from each other along a first virtual circle at a first distance from the center point of the body portion, and
    second protrusions spaced apart from each other along a second virtual circle spaced apart from the first virtual circle by a radiation pitch, and
    one of the first protrusions and two of the second protrusions closest to the one of the first protrusions form the triangle.

12. The wafer chuck of claim 11, wherein the second virtual circle is at a second distance greater than the first distance from the center point of the body portion, or at a third distance that is less than the first distance from the center of the body portion.

13. The wafer chuck of claim 10, wherein the body portion includes a paddle insertion portion having an insertion groove into which a wafer transfer paddle is configured to be inserted from a circumference to the center portion of the body portion, and
    the vacuum barrier portion includes a circular structure spaced apart by a distance from the circumference of the body portion on the top surface of the body portion, except for the paddle insertion portion.

14. A wafer chuck comprising:
    a body portion;
    a paddle insertion portion including an insertion groove into which a wafer transfer paddle is configured to be inserted, on one side of the body portion;
    a vacuum barrier portion including a wall structure spaced apart from a center point of the body portion, on the body portion except for the paddle insertion portion, and at a same distance from the center point of the body portion;
    protrusions inside and outside the vacuum barrier portion, protruding from a top surface of the body portion and spaced apart from each other;
    a central vacuum portion in a vicinity of a center portion inside of the vacuum barrier portion and including, the central vacuum portion including sub-vacuum holes arranged around a central protrusion of the protrusions and between the central protrusion and protrusions adjacent to the central protrusion; and
    a peripheral vacuum portion in a vicinity of a periphery portion inside of the vacuum barrier portion and including peripheral vacuum holes spaced apart from each other penetrating the body portion.

15. The wafer chuck of claim 14, wherein the sub-vacuum holes include a hexagonal structure, and a separation distance between the sub-vacuum holes is the same.

16. The wafer chuck of claim 14, wherein the peripheral vacuum holes are inside the vacuum barrier portion on both sides of the paddle insertion portion.

17. The wafer chuck of claim 14, wherein an inner region of the vacuum barrier portion on the body portion includes one vacuum region by the central vacuum portion and the peripheral vacuum portion.

\* \* \* \* \*